(12) United States Patent
Zhang et al.

(10) Patent No.: US 11,538,930 B2
(45) Date of Patent: Dec. 27, 2022

(54) BIDIRECTIONAL BLOCKING MONOLITHIC HETEROGENEOUS INTEGRATED CASCODE-STRUCTURE FIELD EFFECT TRANSISTOR, AND MANUFACTURING METHOD THEREOF

(71) Applicant: Xidian University, Xi'an (CN)

(72) Inventors: Chunfu Zhang, Xi'an (CN); Weihang Zhang, Xi'an (CN); Jiaqi Zhang, Xi'an (CN); Guofang Yang, Xi'an (CN); Yichang Wu, Xi'an (CN); Dazheng Chen, Xi'an (CN); Jincheng Zhang, Xi'an (CN); Yue Hao, Xi'an (CN)

(73) Assignee: Xidian University, Xi'an (CN)

( * ) Notice: Subject to any disclaimer, the term of this patent is extended or adjusted under 35 U.S.C. 154(b) by 106 days.

(21) Appl. No.: 17/201,234

(22) Filed: Mar. 15, 2021

(65) Prior Publication Data

US 2022/0037515 A1    Feb. 3, 2022

(30) Foreign Application Priority Data

Jul. 30, 2020 (CN) .......................... 202010747893.1

(51) Int. Cl.
  *H01L 29/778* (2006.01)
  *H01L 27/06* (2006.01)
  *H01L 27/088* (2006.01)
  *H01L 29/66* (2006.01)

(52) U.S. Cl.
  CPC ........ *H01L 29/778* (2013.01); *H01L 27/0617* (2013.01); *H01L 27/0883* (2013.01); *H01L 29/66462* (2013.01)

(58) Field of Classification Search
  CPC .............. H01L 29/778; H01L 27/0617; H01L 27/0883; H01L 29/66462; H01L 27/085; H01L 21/8258; H01L 29/2003; H01L 29/7786; H01L 29/475; H01L 29/66477; H01L 29/78
  See application file for complete search history.

(56) References Cited

U.S. PATENT DOCUMENTS

| | | | | |
|---|---|---|---|---|
| 6,078,067 A | * | 6/2000 | Oikawa | H01L 27/0605 438/572 |
| 2007/0295991 A1 | * | 12/2007 | Kato | H01L 29/8128 257/E29.127 |
| 2015/0263100 A1 | * | 9/2015 | Deboy | H01L 29/7786 327/537 |

\* cited by examiner

*Primary Examiner* — Mohammed R Alam
(74) *Attorney, Agent, or Firm* — Jordan IP Law, LLC; Todd A. Vaughn (57) ABSTRACT

A bidirectional blocking monolithic heterogeneous integrated Cascode-structure field effect transistor, which mainly solves a problem that the existing monolithic heterogeneous integrated Cascode-structure field effect transistor has no reverse blocking characteristic. The field effect transistor includes a substrate, a GaN buffer layer, an AlGaN barrier layer and a SiN isolation layer, wherein an isolation groove is etched in the middle of the SiN isolation layer, a Si active layer is printed on the SiN isolation layer on one side of the isolation groove so as to prepare a Si metal oxide semiconductor field effect transistor, and a GaN high-electron-mobility transistor is prepared on the other side of the isolation groove, and a drain electrode of the GaN high-electron-mobility transistor is in Schottky contact with the AlGaN barrier layer to form a bidirectional blocking monolithic heterogeneous integrated Cascode-structure field effect transistor.

10 Claims, 3 Drawing Sheets

BIDIRECTIONAL BLOCKING MONOLITHIC HETEROGENEOUS INTEGRATED CASCODE-STRUCTURE FIELD EFFECT TRANSISTOR, AND MANUFACTURING METHOD THEREOF

CROSS REFERENCE TO RELATED APPLICATIONS

The present application claims priority under 35 U.S.C. § 119 to Chinese Patent Application No. 202010747893.1 filed (Jul. 30, 2020), which is hereby incorporated by reference in their complete respective entireties.

TECHNICAL FIELD

The present disclosure belongs to the technical field of semiconductor devices, and particularly relates to a Cascode-structure field effect transistor, which can be used as a power converter or an inverter of automobiles, aerospace and power stations.

BACKGROUND

Figure 1:
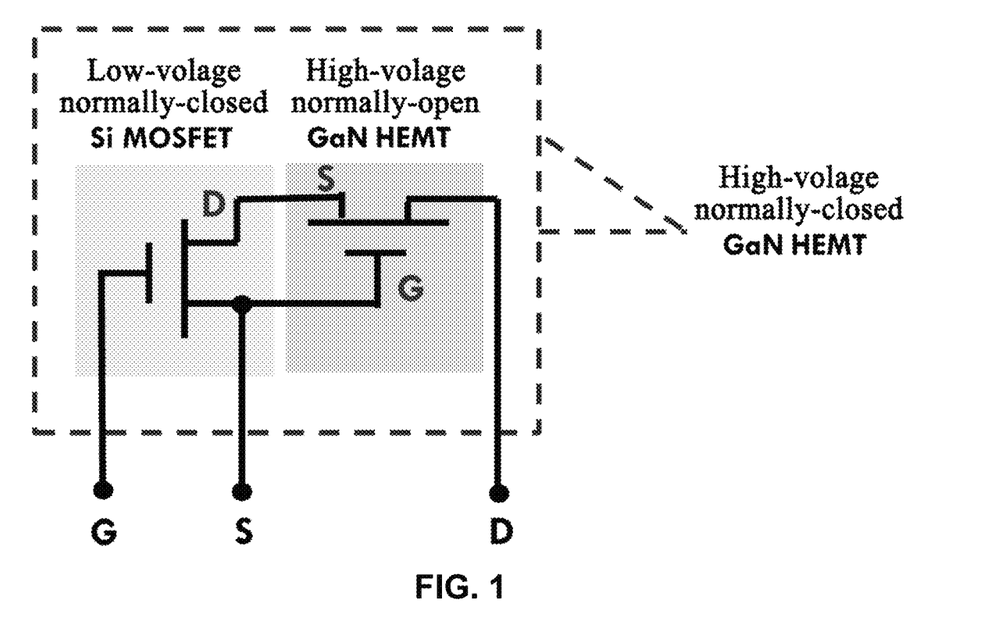
FIG. 1 is a circuit schematic diagram of an existing Cascode-structure field effect transistor.

In the late 1980s, scientists grew high-quality GaN and AlGaN on silicon carbide and sapphire substrates by inserting a gallium nitride buffer layer, and then GaN high-electron-mobility transistors entered a period of rapid development. The GaN high-electron-mobility transistor device has many advantages: first, it has higher working voltage and working frequency; second, it has lower on-resistance and smaller input/output capacitance; and third, it has higher radiation resistance and higher high-temperature resistance. Due to the aforementioned advantages, the GaN high-electron-mobility transistor device is often used in fields of power electronics and microwaves, and compared with a depletion-mode GaN high-electron-mobility transistor device, an enhancement-mode GaN high-electron-mobility transistor device has the advantages of reduced design cost and expanded application fields. For example, during design of a microwave high-power chip, the enhancement-mode GaN high-electron-mobility transistor device does not need the design of power supply with a negative gate voltage because it has a forward threshold voltage, which will greatly reduce the design cost of the chip; and furthermore, the enhancement-mode GaN high-electron-mobility transistor device is turned on only at a positive gate voltage, and thus it can be applied in a low-power digital circuit. Because the enhancement-mode GaN high-electron-mobility transistor device has so many advantages, a lot of research has been done by people on it. In order to realize the enhancement-mode GaN high-electron-mobility transistor device, there have been many manufacturing methods of it in the industry, among which a Cascode structure composed of an enhancement-mode low-voltage Si metal oxide semiconductor field effect transistor and a depletion-mode high-voltage GaN high-electron-mobility transistor device is commonly used, as shown in FIG. 1. With this structure, it is more convenient to turn on a GaN high-electron-mobility transistor device that is originally in a depletion mode when a forward gate voltage is applied.

Figure 2:
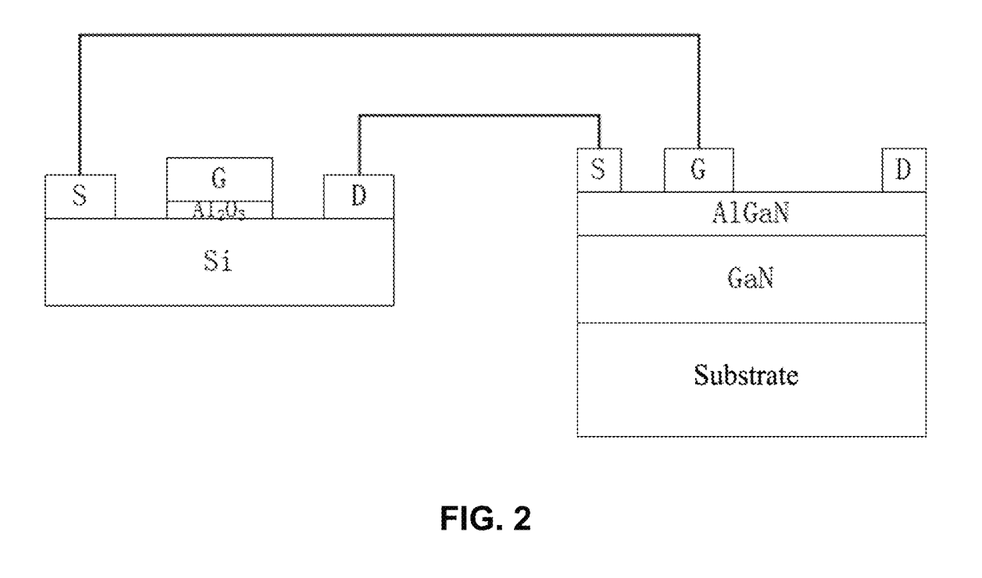
FIG. 2 is a schematic diagram of an existing two-chip packaged Cascode-structure field effect transistor.

At present, IR and Transform, international rectifier companies, are working hard to develop an enhancement-mode GaN high-electron-mobility transistor device based on this structure. Up to now, however, the fabrication of the Cascode-structure GaN high-electron-mobility transistor device is mostly based on hybrid integration, i.e., achieved by encapsulating and bonding a silicon chip and a gallium nitride chip, as shown in FIG. 2. For the Cascode-structure GaN high-electron-mobility field effect transistor HEMT manufactured by this method, an oscillation phenomenon is caused due to the introduction of a large parasitic inductance by the bonding wire during a fast switching process, which leads to the decrease of system stability and the increase of switching loss. Therefore, in recent years, people have tried their best and successfully integrated Si and GaN on a single chip, and thus realized the monolithic integrated Cascode-structure GaN HEMT to eliminate the large parasitic inductance introduced by the bonding wire, thereby improving the working frequency and stability of the circuit system and reducing the switching loss.

Reverse blocking ability is the basis of many power electronic applications, such as a matrix converter, a multilevel inverter and some resonant converters. However, a general Cascode-structure field effect transistor has no reverse blocking ability, which greatly limits its application in the field of power electronics.

SUMMARY

An objective of the present disclosure is to provide a bidirectional blocking monolithic heterogeneous integrated Cascode-structure field effect transistor and a manufacturing method thereof, aiming at the shortcomings of the prior art mentioned above, so that the monolithic heterogeneous integrated Cascode-structure field effect transistor not only has a conventional forward blocking characteristic, but also has a reverse blocking characteristic, thereby expanding the application range of the device.

In order to achieve the aforementioned objective, a bidirectional blocking monolithic heterogeneous integrated Cascode-structure field effect transistor of the present disclosure includes, from bottom to top, a substrate, a GaN buffer layer, an AlGaN barrier layer and a SiN isolation layer, wherein an isolation groove deep to the GaN buffer layer is etched in the middle of the SiN isolation layer; a Si active layer is arranged on the SiN isolation layer on one side of the isolation groove, a first source electrode and a first drain electrode are arranged on both sides of the Si active layer, a gate dielectric layer is arranged between the source and drain electrodes, and a first gate electrode is arranged on the gate dielectric layer to form a Si metal oxide semiconductor field effect transistor; and a second source electrode, a second gate electrode and a second drain electrode are transversely and sequentially arranged on the AlGaN barrier layer on the other side of the isolation groove to form a GaN high-electron-mobility transistor, wherein: the second drain electrode forms Schottky contact with the AlGaN barrier layer to block the reverse conduction of the GaN high-electron-mobility transistor and realize a reverse blocking characteristic of the Cascode-structure field effect transistor.

Further, the Si active layer is printed on the SiN isolation layer on one side of the isolation groove to form a heterogeneous integrated monolithic chip of Si and GaN.

Further, the first drain electrode and the second source electrode are electrically connected through a first metal interconnection strip; and the first source electrode and the second gate electrode are electrically connected through a second metal interconnection strip.

Further, the first gate electrode is made of tantalum nitride; and the first source electrode and the first drain electrode are both made of nickel, and respectively form ohmic contact with the Si active layer.

Further, the second gate electrode and the second drain electrode are both made of nickel and gold, and the second gate electrode forms Schottky contact with the AlGaN buffer layer; the second source electrode is made of titanium, aluminum, nickel and gold from bottom to top, and forms ohmic contact with the AlGaN buffer layer.

Further, the second source electrode has a thickness of 262 nm; and the second gate electrode and the second drain electrode both have a thickness of 150-270 nm.

Further, the substrate has a material of sapphire, silicon carbide or silicon, and a thickness of 400-500 μm; the GaN buffer layer has a thickness of 1-2 μm; the AlGaN barrier layer has a thickness of 20-30 nm; the SiN isolation layer has a thickness of 150-200 nm; and the first metal interconnection strip and the second metal interconnection strip both have a thickness of 200-300 nm.

Further, the Si active layer has a thickness of 100-200 nm; the first gate electrode has a thickness of 100-200 nm; the first source electrode and the first drain electrode both have a thickness of 30-100 nm; and the gate dielectric layer between the first source electrode and the first drain electrode has a thickness of 20-30 nm.

In order to achieve the aforementioned objective, the present disclosure provides a method for manufacturing a bidirectional blocking monolithic heterogeneous integrated Cascode-structure field effect transistor, including the steps of:

1) employing metal organic chemical vapor deposition and atomic layer deposition processes to epitaxially grow a GaN buffer layer on a substrate; to epitaxially grow a AlGaN barrier layer on the GaN buffer layer; to deposit a SiN isolation layer on the AlGaN barrier layer, so as to obtain a SiN/AlGaN/GaN/substrate chip;

2) employing photolithography and reactive ion etching processes to form a monocrystalline silicon thin-film island on a SOI wafer;

3) employing a wet etching process to etch away a buried oxide layer not covered by the monocrystalline silicon thin-film island from a sample obtained in 2) that is placed in a 49% HF solution;

4) employing a photolithography process to make anchor points at an edge of the monocrystalline silicon thin-film, so as to prevent the monocrystalline silicon thin-film from shifting and falling off after subsequently the buried oxide layer is etched away completely;

5) employing a wet etching process to completely etch away the buried oxide layer from the sample provided with the anchor points in a 49% HF solution, so that the monocrystalline silicon thin-film falls onto the base of the SOI wafer.

6) employing a transfer printing technology to transfer the monocrystalline silicon thin-film obtained in 5) onto the SiN/AlGaN/GaN/substrate chip;

7) employing photolithography and reactive ion etching processes to etch an isolation groove with a depth of 300-350 nm on the sample obtained in 6) and form a Si/SiN/AlGaN/GaN island and a SiN/AlGaN/GaN island on both sides of the isolation groove respectively;

8) employing an ion implantation process to implant phosphorus ions at a dose of 5×1015 cm2 and an energy of 30 keV onto the monocrystalline silicon thin-film of the Si/SiN/AlGaN/GaN island, and annealing under a nitrogen atmosphere at 1,000° C. for 60 s to activate impurities and form N-type heavily doped source and drain regions;

9) employing reactive ion etching and electron beam evaporation processes to etch away SiN on the source region on the SiN/AlGaN/GaN island, depositing titanium metal with a thickness of 22 nm, aluminum metal with a thickness of 140 nm, nickel metal with a thickness of 55 nm and gold metal with a thickness of 45 nm sequentially on the source region to form a source electrode of a GaN high-electron-mobility transistor, and annealing under a nitrogen atmosphere with a temperature of 875° C. for 30 s, so that ohmic contact is formed between the source electrode and the AlGaN;

10) employing reactive ion etching and electron beam evaporation processes to etch away SiN on the gate and drain regions on the SiN/AlGaN/GaN island, and then sequentially depositing nickel metal with a thickness of 45-70 nm and gold metal with a thickness of 100-200 nm on the gate and drain regions after the SiN is etched away, so as to form a gate electrode and a drain electrode of the GaN high-electron-mobility transistor respectively;

11) employing an atomic layer deposition process to deposit aluminum sesquioxide with a thickness of 20-30 nm on the whole sample under conditions of a temperature of 300° C. and a nitrogen atmosphere, so as to form a gate dielectric layer of the Si metal oxide semiconductor field effect transistor; and then employing a magnetron sputtering process to spray tantalum nitride with a thickness of 100-200 nm on the aluminum sesquioxide thin-film above the undoped monocrystalline silicon thin-film, so as to form a gate electrode of the Si metal oxide semiconductor field effect transistor;

12) employing wet etching and electron beam evaporation processes to etch away aluminum sesquioxide on the source and drain regions of the monocrystalline silicon thin-film, depositing nickel metal with a thickness of 30-100 nm on the source and drain regions to form a source electrode and a drain electrode of the Si metal oxide semiconductor field effect transistor, and annealing under a nitrogen atmosphere with a temperature of 400° C. for 1 min, so that the source and drain electrodes form ohmic contact with the heavily doped source and drain regions;

13) employing a wet etching process to etch away aluminum sesquioxide covering the gate, source and drain electrodes of the GaN high-electron-mobility transistor with a HF solution with a concentration of 5%, so that the gate, source and drain electrodes of the GaN high-electron-mobility transistor are exposed to the outside; and 14) employing an electron beam evaporation process to deposit aluminum metal with a thickness of 200-300 nm on the aluminum sesquioxide dielectric layer, and forming metal interconnections between the drain electrode of the Si metal oxide semiconductor field effect transistor and the source electrode of the GaN high-electron-mobility transistor and between the source electrode of the Si metal oxide semiconductor field effect transistor and the gate electrode of the GaN high-electron-mobility transistor, thereby completing the manufacture of the bidirectional blocking monolithic heterogeneous integrated Cascode-structure field effect transistor.

Compared with the prior art, in the present disclosure, since in the monolithic heterogeneous integrated Cascode-structure field effect transistor the drain electrode of the GaN high-electron-mobility transistor is in Schottky contact with the AlGaN barrier layer, the monolithic heterogeneous integrated Cascode-structure field effect transistor has a bidirectional blocking characteristic, and thus the application range of the monolithic heterogeneous integrated Cascode-structure field effect transistor device is expanded.

DETAILED DESCRIPTION

The embodiments of the present disclosure will be described hereafter in connection with the accompanying drawings.

Figure 3:
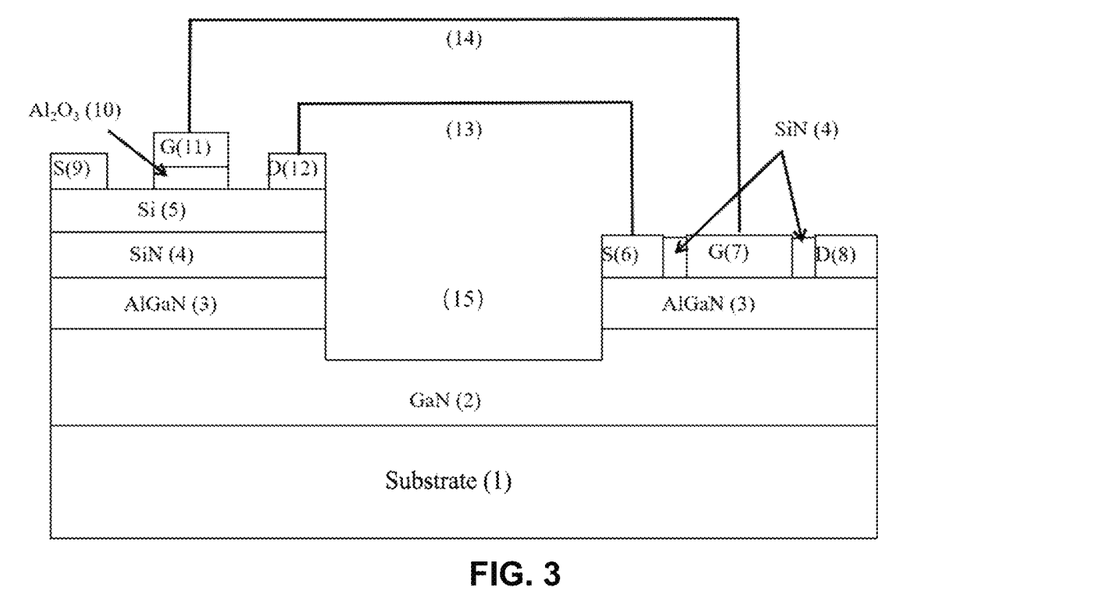
FIG. 3 is a schematic cross-sectional structure diagram of the bidirectional blocking monolithic heterogeneous integrated Cascode-structure field effect transistor of the present disclosure.
Figure 4:
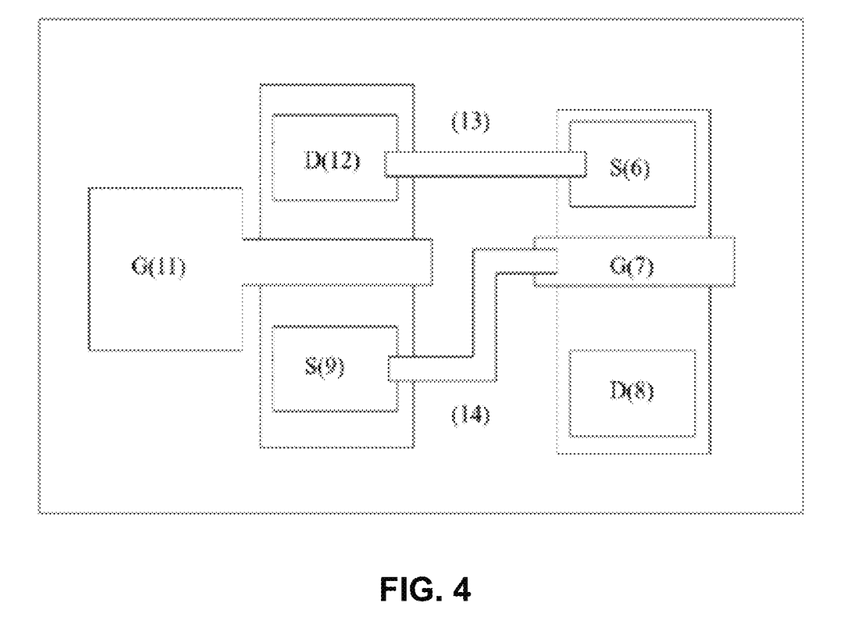
FIG. 4 is a top view of FIG. 3.

Referring to FIGS. 3 and 4, the bidirectional blocking monolithic heterogeneous integrated Cascode-structure field effect transistor of the present disclosure includes, from bottom to top, a substrate 1, a GaN buffer layer 2, an AlGaN barrier layer 3 and a SiN isolation layer 4, wherein an isolation groove 15 is etched in the middle of the SiN isolation layer 4, which penetrates through the AlGaN barrier layer 3 and reaches as deep as the GaN buffer layer 2 to cut off two-dimensional electron gas and prevent leakage among devices. The substrate 1 has a material of sapphire, silicon carbide or silicon, and a thickness of 400-500 µm; the GaN buffer layer 2 has a thickness of 1-2 µm; the AlGaN barrier layer 3 has a thickness of 20-30 nm; and the SiN isolation layer 4 has a thickness of 150-200 nm.

A Si active layer 5 is printed on the SiN isolation layer 4 on one side of the isolation groove 15, and a first source electrode 9 and a first drain electrode 12 are arranged on both sides of the Si active layer 5; an aluminum sesquioxide gate dielectric layer 10 is arranged between the source and drain electrodes; and a first gate electrode 11 is arranged on the gate dielectric layer 10 to form a Si metal oxide semiconductor field effect transistor device. The Si active layer 5 has a thickness of 100-200 nm; the first gate electrode 11 has a thickness of 100-200 nm; the first source electrode 9 and the first drain electrode 12 both have a thickness of 30-100 nm; and the gate dielectric layer 10 has a thickness of 20-30 nm.

A second source electrode 6, a second gate electrode 7, and a second drain electrode 8 are transversely and sequentially arranged on the AlGaN barrier layer 3 on the other side of the isolation groove 15 to form a GaN high-electron-mobility transistor device. The second source electrode 6 has a thickness of 262 nm; and the second gate electrode 7 and the second drain electrode 8 both have a thickness of 150-270 nm.

The first drain electrode 12 and the second source electrode 6 are electrically connected through a first metal interconnection strip 13; and the first source electrode 9 and the second gate electrode 7 are electrically connected through a second metal interconnection strip 14. The first metal interconnection strip 13 and the second metal interconnection strip 14 both have a thickness of 200-300 nm.

At this point, the manufacture of the bidirectional blocking monolithic heterogeneous integrated Cascode-structure field effect transistor is completed.

Figure 5A:
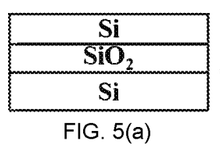
FIGS. 5(a) through 5(p) is a schematic flow chart of manufacturing the bidirectional blocking monolithic heterogeneous integrated Cascode-structure field effect transistor according to the present disclosure.
Figure 5B:
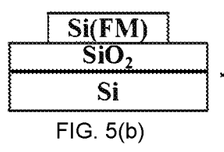
Figure 5C:
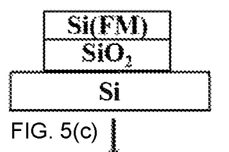
Figure 5D:
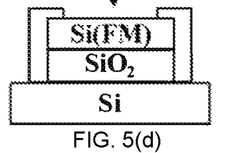
Figure 5E:
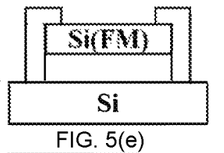
Figure 5F:
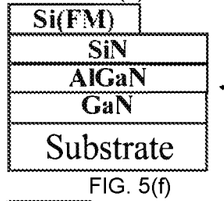
Figure 5G:
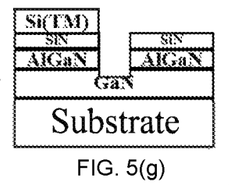
Figure 5H:
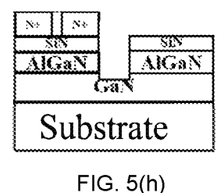
Figure 5I:
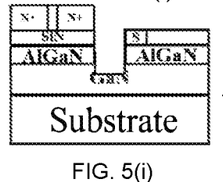
Figure 5J:
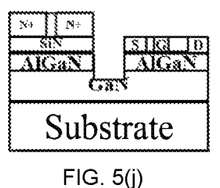
Figure 5K:
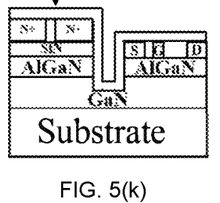
Figure 5L:
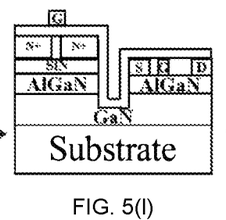
Figure 5M:
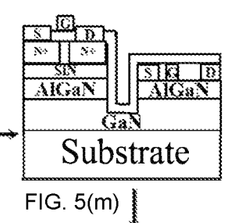
Figure 5N:
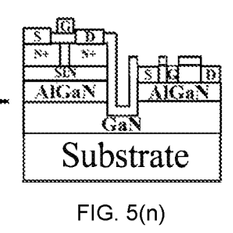

Referring to FIGS. 5(a) to 5(n), the following three examples are given for the method of manufacturing a Cascode-structure field effect transistor based on monolithic heterogeneous integration according to the present disclosure.

Example 1: Manufacture of Bidirectional Blocking Monolithic Heterogeneous Integrated Cascode-Structure Field Effect Transistor with a Monocrystalline Silicon Thin-Film Thickness of 200 nm on a Sapphire Substrate Step 1. Preparation of a SiN/AlGaN/GaN/Sapphire Substrate Chip.

Figure 5O:
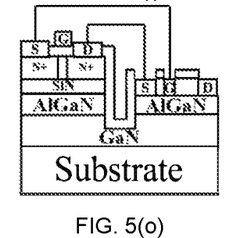
Figure 5P:
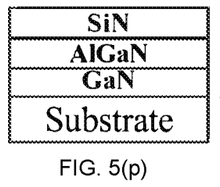

By employing metal organic chemical vapor deposition and atomic layer deposition processes, a GaN buffer layer was epitaxially grown on a sapphire substrate; a AlGaN barrier layer was epitaxially grown on the GaN buffer layer; and a SiN isolation layer was deposited on the AlGaN barrier layer, so as to obtain a SiN/AlGaN/GaN/sapphire substrate chip, as shown in FIG. 5(p).

Step 2. Formation of a Monocrystalline Silicon Thin-Film Island on a SOI Wafer for Isolation.

The SOI wafer with a monocrystalline silicon thin-film thickness of 200 nm and a buried oxide layer thickness of 200 nm, was selected, as shown in FIG. 5(a).

By employing photolithography and reactive ion etching processes, a monocrystalline silicon thin-film island was etched on an upper portion of a SOI wafer, as shown in FIG. 5(b);

Step 3. Partial Etching of the Exposed Buried Oxide Layer.

By employing a wet etching process, the SOI wafer on which the monocrystalline silicon thin-film island was etched was placed into a 49% HF solution for 15 min, so as to etch away the buried oxide layer not uncovered by the monocrystalline silicon thin-film island, as shown in FIG. 5(c).

Step 4. Make of Photoresist Anchor Points.

By employing a photolithography process, anchor points were made at an edge of the monocrystalline silicon thin-film on the SOI wafer, so as to prevent the monocrystalline silicon thin-film from shifting and falling off after subsequently the buried oxide layer was etched away completely, as shown in FIG. 5(d).

Step 5. Completely Etching of the Whole Buried Oxide Layer for Releasing the Monocrystalline Silicon Thin-Film.

By employing a wet etching process, the SOI wafer on which the anchor points were made, was placed into a 49% HF solution for 2 h to completely etch away the buried oxide layer, so that the monocrystalline silicon thin-film fell onto the base of the SOI wafer, as shown in FIG. 5(e).

Step 6. Transfer of the Monocrystalline Silicon Thin-Film onto the SiN/AlGaN/GaN/Sapphire Substrate Chip, as Shown in FIG. 5(f).

By employing a transfer printing technology, the 200 nm monocrystalline silicon thin-film on the SOI wafer was transferred onto the SiN/AlGaN/GaN/sapphire substrate chip with a SiN isolation layer thickness of 200 nm, a AlGaN barrier layer thickness of 30 nm, a GaN buffer layer thickness of 2 µm and a sapphire substrate thickness of 500 µm. The specific implementation of this step was as follows:

6a) the SiN/AlGaN/GaN/sapphire substrate chip was placed in acetone, absolute ethanol and deionized water sequentially for ultrasonic cleaning each for 10 min, and then blow-dried with a nitrogen gun;

6b) a solid-state polydimethylsiloxane PDMS was laminated to the SOI wafer from which the buried oxide layer was etched away, and then the two were separated at a speed of 10 cm/s, wherein because the polydimethylsiloxane PDMS was an viscoelastic object of which the surface adhesion was in direct proportional to the separation rate, the separation could be done quickly to enable the PDMS to have a greater adhesive force, so that the monocrystalline silicon thin-film adhered onto the polydimethylsiloxane PDMS;

6c) the solid-state polydimethylsiloxane PDMS to which the monocrystalline silicon thin-film adhered, was laminated to the SiN/AlGaN/GaN/sapphire substrate chip, and then the two were separated at a speed of 1 mm/s, wherein due to the slow separation speed, the adhesive force of the polydimethylsiloxane PDMS to the monocrystalline silicon thin-film was exhibited as smaller than that between the monocrystalline silicon thin-film and the SiN/AlGaN/GaN/sapphire substrate chip, so that the silicon thin-film could be acquired by the SiN/AlGaN/GaN/sapphire substrate chip, thereby completing the transfer of the silicon thin-film.

Step 7. Manufacture of Island Isolation for the Si Metal Oxide Semiconductor Field Effect Transistor and the GaN High-Electron-Mobility Transistor.

By employing photolithography and reactive ion etching processes, an isolation groove was etched in the SiN/AlGaN/GaN/sapphire substrate chip onto which the monocrystalline silicon thin-film was transferred, so as to cut off the two-dimensional electron gas and form a Si/SiN/AlGaN/GaN island and a SiN/AlGaN/GaN island on both sides of the isolation groove respectively, as shown in FIG. 5(g).

Step 8. Doping of the Monocrystalline Silicon Thin-Film for Formation of the Source and Drain Regions of the Si Metal Oxide Semiconductor Field Effect Transistor.

By employing an ion implantation process, phosphorus ions at a dose of 5×1015 cm2 and an energy of 30 keV were implanted onto the monocrystalline silicon thin-film of the Si/SiN/AlGaN/GaN island; and by employing a rapid thermal annealing process, annealing was conducted under a nitrogen atmosphere at 1,000° C. for 60 s to activate impurities and form N-type heavily doped source and drain regions, as shown in FIG. 5(h).

Step 9. Manufacture of the Source Electrode of the GaN High-Electron-Mobility Transistor.

By employing reactive ion etching and electron beam evaporation processes, SiN on the source region on the SiN/AlGaN/GaN island was etched away; titanium metal with a thickness of 22 nm, aluminum metal with a thickness of 140 nm, nickel metal with a thickness of 55 nm and gold metal with a thickness of 45 nm were sequentially deposited on the source region to form a source electrode of a GaN high-electron-mobility transistor, and annealing was conducted under a nitrogen atmosphere with a temperature of 875° C. for 30 s, so that ohmic contact was formed between the source electrode and the AlGaN, as shown in FIG. 5(i).

Step 10. Manufacture of the Gate and Drain Electrodes of the GaN High-Electron-Mobility Transistor.

By employing reactive ion etching and electron beam evaporation processes, SiN on the gate and drain regions on the SiN/AlGaN/GaN island was etched away, and then nickel metal with a thickness of 45 nm and gold metal with a thickness of 150 nm were sequentially deposited on the gate and drain regions after the SiN was etched away, so as to form a gate electrode and a drain electrode of the GaN high-electron-mobility transistor respectively, as shown in FIG. 5(j).

Step 11. Manufacture of the Gate Dielectric and Gate Electrode of the Si Metal Oxide Semiconductor Field Effect Transistor Device.

Firstly, by employing an atomic layer deposition process, under the condition of a temperature of 300° C. and a nitrogen atmosphere, aluminum sesquioxide with a thickness of 30 nm was deposited on the whole sample, as the gate dielectric layer of the Si metal oxide semiconductor field effect transistor device, as shown in FIG. 5(k); then, by employing a magnetron sputtering process, tantalum nitride with a thickness of 200 nm was sputtered on the aluminum sesquioxide thin-film above the undoped monocrystalline silicon thin-film, as the gate electrode of the Si metal oxide semiconductor field effect transistor device, as shown in FIG. 5(l).

Step 12. Manufacture of the Source and Drain Electrodes of the Si Metal Oxide Semiconductor Field Effect Transistor Device.

By employing wet etching and electron beam evaporation processes, aluminum sesquioxide on the source and drain regions of the monocrystalline silicon thin-film was etched away, nickel metal with a thickness of 60 nm was deposited on the source and drain regions to form a source electrode and a drain electrode of the Si metal oxide semiconductor field effect transistor, and annealing was conducted under a nitrogen atmosphere with a temperature of 400° C. for 1 min, so that the source and drain electrodes formed ohmic contact with the heavily doped source and drain regions, as shown in FIG. 5(m).

Step 13. Hole Drilling of Electrode.

By employing a wet etching process, aluminum sesquioxide covering the gate, source and drain electrodes of the GaN high-electron-mobility transistor was etched away with a HF solution with a concentration of 5%, so that the gate, source and drain electrodes of the device were exposed to the outside.

Step 14. Manufacture of a Metal Interconnection Strip Between Two Devices.

By employing an electron beam evaporation process, aluminum metal with a thickness of 300 nm was deposited on the aluminum sesquioxide dielectric layer, so as to form metal interconnections respectively between the drain electrode of the Si metal oxide semiconductor field effect transistor and the source electrode of the GaN high-electron-mobility transistor and between the source electrode of the Si metal oxide semiconductor field effect transistor and the gate electrode of the GaN high-electron-mobility transistor, thereby completing the manufacture of the bidirectional blocking monolithic heterogeneous integrated Cascode-structure field effect transistor, as shown in FIG. 5(o).

Example 2: Manufacture of Bidirectional Blocking Monolithic Heterogeneous Integrated Cascode-Structure Field Effect Transistor with a Monocrystalline Silicon Thin-Film Thickness of 100 nm on a Silicon Carbide Substrate Step A. Preparation of a SiN/AlGaN/GaN/Silicon Carbide Substrate Chip.

By employing metal organic chemical vapor deposition and atomic layer deposition processes, a GaN buffer layer was epitaxially grown on a silicon carbide substrate; a AlGaN barrier layer was epitaxially grown on the GaN buffer layer; and a SiN isolation layer was deposited on the AlGaN barrier layer, so as to obtain a SiN/AlGaN/GaN/silicon carbide substrate chip, as shown in FIG. 5(p).

Step B. Formation of a Monocrystalline Silicon Thin-Film Island on a SOI Wafer for Isolation.

The SOI wafer with a monocrystalline silicon thin-film thickness of 100 nm and a buried oxide layer thickness of 200 nm, was selected, as shown in FIG. 5(a).

By employing photolithography and reactive ion etching processes, a monocrystalline silicon thin-film island was etched on an upper portion of a SOI wafer, as shown in FIG. 5(b);

Step C. Partial Etching of the Exposed Buried Oxide Layer.

The specific implementation of this step was the same as that of the step 3 of example 1, as shown in FIG. 5(c).

Step D. Make of Photoresist Anchor Points.

The specific implementation of this step was the same as that of the step 4 of example 1, as shown in FIG. 5(d).

Step E. Completely Etching of the Whole Buried Oxide Layer for Releasing the Monocrystalline Silicon Thin-Film.

The specific implementation of this step was the same as that of the step 5 of example 1, as shown in FIG. 5(e).

Step F. Transfer of the Monocrystalline Silicon Thin-Film onto the SiN/AlGaN/GaN/Silicon Carbide Substrate Chip, as Shown in FIG. 5(f).

By employing a transfer printing technology, the 100 nm monocrystalline silicon thin-film on the SOI wafer was transferred onto the SiN/AlGaN/GaN/silicon carbide substrate chip with a SiN isolation layer thickness of 175 nm, a AlGaN barrier layer thickness of 25 nm, a GaN buffer layer thickness of 1.5 μm and a silicon carbide substrate thickness of 450 μm. The specific implementation of this step was as follows:

F1) the SiN/AlGaN/GaN/silicon carbide substrate chip was placed in acetone, absolute ethanol and deionized water sequentially for ultrasonic cleaning each for 10 min, and then blow-dried with a nitrogen gun;

F2) a solid-state polydimethylsiloxane PDMS was laminated to the SOI wafer from which the buried oxide layer was etched away, and then the two were separated at a speed of 10 cm/s, wherein because the polydimethylsiloxane PDMS was an viscoelastic object of which the surface adhesion was in direct proportional to the separation rate, the separation was done quickly to enable the PDMS to have a greater adhesive force, so that the monocrystalline silicon thin-film adhered onto the polydimethylsiloxane PDMS;

F3) the solid polydimethylsiloxane PDMS to which the monocrystalline silicon thin-film adhered, was laminated to the SiN/AlGaN/GaN/silicon carbide substrate chip, and then the two were separated at a speed of 1 mm/s, wherein due to the slow separation speed, the adhesive force of the polydimethylsiloxane PDMS to the silicon thin-film was exhibited as smaller than that between the silicon thin-film and the SiN/AlGaN/GaN/silicon carbide substrate chip, so that the silicon thin-film could be acquired by the SiN/AlGaN/GaN/silicon carbide substrate chip, thereby completing the transfer of the silicon thin-film.

Step G. Manufacture of Island Isolation for the Si Metal Oxide Semiconductor Field Effect Transistor and the GaN High-Electron-Mobility Transistor.

By employing photolithography and reactive ion etching processes, an isolation groove was etched in the SiN/AlGaN/GaN/silicon carbide substrate chip onto which the monocrystalline silicon thin-film was transferred, so as to cut off the two-dimensional electron gas and form a Si/SiN/AlGaN/GaN island and a SiN/AlGaN/GaN island on both sides of the isolation groove respectively, as shown in FIG. 5(g).

Step H, Doping of the Monocrystalline Silicon Thin-Film for Formation of the Source and Drain Regions of the Si Metal Oxide Semiconductor Field Effect Transistor.

The specific implementation of this step was the same as that of the step 8 of example 1, as shown in FIG. 5(h).

Step I. Manufacture of the Source Electrode of the GaN High-Electron-Mobility Transistor.

The specific implementation of this step was the same as that of the step 9 of example 1, as shown in FIG. 5(i).

Step J. Manufacture of the Gate and Drain Electrodes of the GaN High-Electron-Mobility Transistor.

By employing reactive ion etching and electron beam evaporation processes, SiN on the gate and drain regions on the SiN/AlGaN/GaN island was etched away, and then nickel metal with a thickness of 55 nm and gold metal with a thickness of 175 nm were sequentially deposited on the gate and drain regions after the SiN was etched away, so as to form a gate electrode and a drain electrode of the GaN high-electron-mobility transistor respectively, as shown in FIG. 5(j).

Step K. Manufacture of the Gate Dielectric and Gate Electrode of the Si Metal Oxide Semiconductor Field Effect Transistor Device.

K1) by employing an atomic layer deposition process, under the condition of a temperature of 300° C. and a nitrogen atmosphere, aluminum sesquioxide with a thickness of 25 nm was deposited on the whole sample, as the gate dielectric layer of the Si metal oxide semiconductor field effect transistor, as shown in FIG. 5(k);

K2) by employing a magnetron sputtering process, tantalum nitride with a thickness of 150 nm was sputtered on the aluminum sesquioxide thin-film above the undoped monocrystalline silicon thin-film, as the gate electrode of the Si metal oxide semiconductor field effect transistor device, as shown in FIG. 5(l).

Step L. Manufacture of the Source and Drain Electrodes of the Si Metal Oxide Semiconductor Field Effect Transistor.

L1) by employing wet etching and electron beam evaporation processes, aluminum sesquioxide on the source and drain regions of the monocrystalline silicon thin-film was etched away, and nickel metal with a thickness of 45 nm was deposited on the source and drain regions to form a source electrode and a drain electrode of the Si metal oxide semiconductor field effect transistor;

L2) annealing was conducted under a nitrogen atmosphere with a temperature of 400° C. for 1 min, so that the source and drain electrodes formed ohmic contact with the heavily doped source and drain regions, as shown in FIG. 5(m).

Step M. Hole Drilling of Electrode.

The specific implementation of this step was the same as that of the step 13 of example 1, as shown in FIG. 5(n).

Step N. Manufacture of a Metal Interconnection Strip Between Two Devices.

By employing an electron beam evaporation process, aluminum metal with a thickness of 250 nm was deposited on the aluminum sesquioxide dielectric layer, so as to form metal interconnections respectively between the drain electrode of the Si metal oxide semiconductor field effect transistor and the source electrode of the GaN high-electron-mobility transistor and between the source electrode of the Si metal oxide semiconductor field effect transistor and the gate electrode of the GaN high-electron-mobility transistor, thereby completing the manufacture of the bidirectional blocking monolithic heterogeneous integrated Cascode-structure field effect transistor, as shown in FIG. 5(o).

Example 3: Manufacture of Bidirectional Blocking Monolithic Heterogeneous Integrated Cascode-Structure Field Effect Transistor with a Monocrystalline Silicon Thin-Film Thickness of 150 nm on a Silicon Substrate Step 1. Preparation of a SiN/AlGaN/GaN/Silicon Substrate Chip.

By employing metal organic chemical vapor deposition and atomic layer deposition processes, a GaN buffer layer was epitaxially grown on a silicon substrate; a AlGaN barrier layer was epitaxially grown on the GaN buffer layer; and a SiN isolation layer was deposited on the AlGaN barrier layer, so as to obtain a SiN/AlGaN/GaN/silicon substrate chip, as shown in FIG. 5(p).

Step 2. Formation of a Monocrystalline Silicon Thin-Film Island on a SOI Wafer for Isolation.

The SOI wafer with a monocrystalline silicon thin-film thickness of 150 nm and a buried oxide layer thickness of 200 nm, was selected, as shown in FIG. 5(a).

By employing photolithography and reactive ion etching processes, a monocrystalline silicon thin-film island was etched on an upper portion of a SOI wafer, as shown in FIG. 5(b).

Step 3. Partial Etching of the Exposed Buried Oxide Layer.

The specific implementation of this step was the same as that of the step 3 of example 1, as shown in FIG. 5(c).

Step 4. Make of Photoresist Anchor Points.

The specific implementation of this step was the same as that of the step 4 of example 1, as shown in FIG. 5(d).

Step 5. Completely Etching of the Whole Buried Oxide Layer for Releasing the Monocrystalline Silicon Thin-Film.

The specific implementation of this step was the same as that of the step 5 of example 1, as shown in FIG. 5(e).

Step 6. Transfer of the Monocrystalline Silicon Thin-Film onto the SiN/AlGaN/GaN/Silicon Substrate Chip, as Shown in FIG. 5(f).

By employing a transfer printing technology, the 150 nm monocrystalline silicon thin-film on the SOI wafer was transferred onto the SiN/AlGaN/GaN/silicon substrate chip with a SiN isolation layer thickness of 150 nm, a AlGaN barrier layer thickness of 20 nm, a GaN buffer layer thickness of 1 µm and a silicon substrate thickness of 400 µm. The specific implementation of this step was as follows:

6.1) the SiN/AlGaN/GaN/silicon substrate chip was placed in acetone, absolute ethanol and deionized water sequentially for ultrasonic cleaning each for 10 min, and then blow-dried with a nitrogen gun;

6.2) a solid-state polydimethylsiloxane PDMS was laminated to the SOI wafer from which the buried oxide layer was etched away, and then the two were separated at a speed of 10 cm/s, wherein because the polydimethylsiloxane PDMS was an viscoelastic object of which the surface adhesion was in direct proportional to the separation rate, the separation was done quickly to enable the PDMS to have a greater adhesive force, so that the monocrystalline silicon thin-film adhered onto the polydimethylsiloxane PDMS;

6.3) the solid-state polydimethylsiloxane PDMS to which the monocrystalline silicon thin-film adhered, was laminated to the SiN/AlGaN/GaN/silicon substrate chip, and then the two were separated at a speed of 1 mm/s, wherein due to the slow separation speed, the adhesive force of the polydimethylsiloxane PDMS to the silicon thin-film was exhibited as smaller than that between the silicon thin-film and the SiN/AlGaN/GaN/silicon substrate chip, so that the silicon thin-film could be acquired by the SiN/AlGaN/GaN/silicon substrate chip, thereby completing the transfer of the silicon thin-film.

Step 7. Manufacture of Island Isolation for the Si Metal Oxide Semiconductor Field Effect Transistor and the GaN High-Electron-Mobility Transistor.

By employing photolithography and reactive ion etching processes, an isolation groove was etched in the SiN/AlGaN/GaN/silicon substrate chip onto which the monocrystalline silicon thin-film was transferred, so as to cut off the two-dimensional electron gas and form a Si/SiN/AlGaN/GaN island and a SiN/AlGaN/GaN island on both sides of the isolation groove respectively, as shown in FIG. 5(g).

Step 8. Doping of the Monocrystalline Silicon Thin-Film for Formation of the Source and Drain Regions of the Si Metal Oxide Semiconductor Field Effect Transistor.

The specific implementation of this step was the same as that of the step 8 of example 1, as shown in FIG. 5(h).

Step 9. Manufacture of the Source Electrode of the GaN High-Electron-Mobility Transistor.

The specific implementation of this step was the same as that of the step 9 of example 1, as shown in FIG. 5(i).

Step 10. Manufacture of the Gate and Drain Electrodes of the GaN High-Electron-Mobility Transistor.

By employing reactive ion etching and electron beam evaporation processes, SiN on the gate and drain regions on the SiN/AlGaN/GaN island was etched away, and then nickel metal with a thickness of 50 nm and gold metal with a thickness of 200 nm were sequentially deposited on the gate and drain regions after the SiN was etched away, so as to form a gate electrode and a drain electrode of the GaN high-electron-mobility transistor respectively, as shown in FIG. 5(j).

Step 11. Manufacture of the Gate Dielectric and Gate Electrode of the Si Metal Oxide Semiconductor Field Effect Transistor Device.

Firstly, by employing an atomic layer deposition process, under the condition of a temperature of 300° C. and a nitrogen atmosphere, aluminum sesquioxide with a thickness of 20 nm was deposited on the whole sample, as the gate dielectric layer of the Si metal oxide semiconductor field effect transistor device, as shown in FIG. 5(k); then, by employing a magnetron sputtering process, tantalum nitride with a thickness of 100 nm was sputtered on the aluminum sesquioxide thin-film above the undoped monocrystalline silicon thin-film, as the gate electrode of the Si metal oxide semiconductor field effect transistor device, as shown in FIG. 5(l).

Step 12. Manufacture of the Source and Drain Electrodes of the Si Metal Oxide Semiconductor Field Effect Transistor.

By employing wet etching and electron beam evaporation processes, aluminum sesquioxide on the source and drain regions of the monocrystalline silicon thin-film was etched away, nickel metal with a thickness of 30 nm was deposited on the source and drain regions to form a source electrode and a drain electrode of the Si metal oxide semiconductor field effect transistor, and annealing was conducted under a nitrogen atmosphere with a temperature of 400° C. for 1 min, so that the source and drain electrodes formed ohmic contact with the heavily doped source and drain regions, as shown in FIG. 5(m).

Step 13. Hole Drilling of Electrode.

The specific implementation of this step was the same as that of the step 13 of example 1, as shown in FIG. 5(n).

Step 14. Manufacture of a Metal Interconnection Strip Between Two Devices.

By employing an electron beam evaporation process, aluminum metal with a thickness of 200 nm was deposited on the aluminum sesquioxide dielectric layer, so as to form metal interconnections respectively between the drain electrode of the Si metal oxide semiconductor field effect transistor and the source electrode of the GaN high-electron-mobility transistor and between the source electrode of the Si metal oxide semiconductor field effect transistor and the gate electrode of the GaN high-electron-mobility transistor, thereby completing the manufacture of the bidirectional blocking monolithic heterogeneous integrated Cascode-structure field effect transistor, as shown in FIG. 5(o).

The above description is only three specific examples of the present disclosure, and does not constitute any limitation on the present disclosure. It is apparent to those of skills in the art that after understanding the contents and principles of the present disclosure, it is possible for them to make various modifications and changes in form and details without departing from the principles and structures of the present disclosure, and these modifications and changes based on the ideas of the present disclosure are still within the claimed scope of the present disclosure.

What is claimed is:

1. A bidirectional blocking monolithic heterogeneous integrated Cascode-structure field effect transistor, which comprises:
   from bottom to top:
   a substrate (1),
   a GaN buffer layer (2);
   an AlGaN barrier layer (3);
   a SiN isolation layer (4) having in the middle thereof an isolation groove (15) etched to the GaN buffer layer (2);
   a Si active layer (5) arranged on the SiN isolation layer (4) on one side of the isolation groove (15);
   a first source electrode (9) and a first drain electrode (12) arranged on both sides of the Si active layer (5);
   a gate dielectric layer (10) arranged between the first source electrode and the first drain electrode;
   a first gate electrode (11) arranged on the gate dielectric layer (10) to form a Si metal oxide semiconductor field effect transistor; and
   a second source electrode (6), a second gate electrode (7) and a second drain electrode (8) transversely and sequentially arranged on the AlGaN barrier layer (3) on the other side of the isolation groove (15) to form a GaN high-electron-mobility transistor,
   wherein the second drain electrode (8) forms Schottky contact with the AlGaN barrier layer (3) to block the reverse conduction of the GaN high-electron-mobility transistor and realize a reverse blocking characteristic of the Cascode-structure field effect transistor.

2. The transistor of claim 1, wherein the Si active layer (5) is printed on the SiN isolation layer (4) on one side of the isolation groove to form a heterogeneous integrated monolithic chip of Si and GaN.

3. The transistor of claim 1, wherein:
   the first drain electrode (12) and the second source electrode (6) are electrically connected through a first metal interconnection strip (13), and
   the first source electrode (9) and the second gate electrode (7) are electrically connected through a second metal interconnection strip (14).

4. The transistor of claim 1, wherein:
   the first gate electrode (11) is made of tantalum nitride, and
   the first source electrode (9) and the first drain electrode (12) are both made of nickel, and respectively form ohmic contact with the Si active layer (5).

5. The transistor of claim 1, wherein:
   the second gate electrode (7) and the second drain electrode (8) are both made of nickel and gold, and the second gate electrode (7) forms Schottky contact with the AlGaN buffer layer (3), and
   the second source electrode (6) is made of titanium, aluminum, nickel and gold from bottom to top, and forms ohmic contact with the AlGaN buffer layer (3).

6. The transistor of claim 1, wherein:
   the second source electrode (6) has a thickness of 262 nm, and
   the second gate electrode (2) and the second drain electrode (3) both have a thickness of 150-270 nm.

7. The transistor of claim 1, wherein:
   the substrate (1) has a material of sapphire, silicon carbide or silicon, and a thickness of 400-500 μm,
   the GaN buffer layer (2) has a thickness of 1-2 μm,
   the AlGaN barrier layer (3) has a thickness of 20-30 nm,
   the SiN isolation layer (4) has a thickness of 150-200 nm, and
   the first metal interconnection strip (13) and the second metal interconnection strip (14) both have a thickness of 200-300 nm.

8. The transistor of claim 1, wherein:
   the Si active layer (5) has a thickness of 100-200 nm,
   the first gate electrode (11) has a thickness of 100-200 nm,
   the first source electrode (9) and the first drain electrode (12) both have a thickness of 30-100 nm, and
   the gate dielectric layer (10) between the first source electrode (9) and the first drain electrode (12) has a thickness of 20-30 nm.

9. A method for manufacturing a bidirectional blocking monolithic heterogeneous integrated Cascode-structure field effect transistor, the method comprising:
   employing metal organic chemical vapor deposition and atomic layer deposition processes to epitaxially grow a GaN buffer layer on a substrate; to epitaxially grow a AlGaN barrier layer on the GaN buffer layer; to deposit a SiN isolation layer on the AlGaN barrier layer, so as to obtain a SiN/AlGaN/GaN/substrate chip;
   employing photolithography and reactive ion etching processes to form a monocrystalline silicon thin-film island on a SOI wafer;
   employing a wet etching process to etch away a buried oxide layer not covered by the monocrystalline silicon thin-film island from the monocrystalline silicon thin-film island on the SOI wafer in a 49% HF solution;
   employing a photolithography process to make anchor points at an edge of the monocrystalline silicon thin-film, so as to prevent the monocrystalline silicon thin-film from shifting and falling off after subsequently the buried oxide layer is etched away completely;
   employing a wet etching process to completely etch away the buried oxide layer from the sample provided with the anchor points in a 49% HF solution, so that the monocrystalline silicon thin-film falls onto the base of the SOI wafer;
   employing a transfer printing technology to transfer the monocrystalline silicon thin-film, that fell onto the base of the SOI wafer, onto the SiN/AlGaN/GaN/substrate chip;
   employing photolithography and reactive ion etching processes to etch an isolation groove with a depth of 300-350 nm on the SiN/AlGaN/GaN/substrate chip having the monocrystalline silicon thin-film on the SOI wafer and form a Si/SiN/AlGaN/GaN island and a SiN/AlGaN/GaN island on both sides of the isolation groove respectively;

employing an ion implantation process to implant phosphorus ions at a dose of $5\times10^{15}$ cm$^2$ and an energy of 30 keV onto the monocrystalline silicon thin-film of the Si/SiN/AlGaN/GaN island, and annealing under a nitrogen atmosphere at 1,000° C. for 60 s to activate impurities and form N-type heavily doped source and drain regions;

employing reactive ion etching and electron beam evaporation processes to etch away SiN on the source region on the SiN/AlGaN/GaN island, then depositing titanium metal with a thickness of 22 nm, aluminum metal with a thickness of 140 nm, nickel metal with a thickness of 55 nm and gold metal with a thickness of 45 nm sequentially on the source region to form a source electrode of a GaN high-electron-mobility transistor, and annealing under a nitrogen atmosphere with a temperature of 875° C. for 30 s, so that ohmic contact is formed between the source electrode and the AlGaN;

employing reactive ion etching and electron beam evaporation processes to etch away SiN on the gate and drain regions on the SiN/AlGaN/GaN island, and then sequentially depositing nickel metal with a thickness of 45-70 nm and gold metal with a thickness of 100-200 nm on the gate and drain regions after the SiN is etched away, so as to form a gate electrode and a drain electrode of the GaN high-electron-mobility transistor respectively;

employing an atomic layer deposition process to deposit aluminum sesquioxide with a thickness of 20-30 nm on the whole sample under conditions of a temperature of 300° C. and a nitrogen atmosphere, so as to form a gate dielectric layer of the Si metal oxide semiconductor field effect transistor; and then employing a magnetron sputtering process to spray tantalum nitride with a thickness of 100-200 nm on the aluminum sesquioxide thin-film above the undoped monocrystalline silicon thin-film, so as to form a gate electrode of the Si metal oxide semiconductor field effect transistor;

employing wet etching and electron beam evaporation processes to etch away aluminum sesquioxide on the source and drain regions of the monocrystalline silicon thin-film, depositing nickel metal with a thickness of 30-100 nm on the source and drain regions to form a source electrode and a drain electrode of the Si metal oxide semiconductor field effect transistor, and annealing under a nitrogen atmosphere with a temperature of 400° C. for 1 min, so that the source and drain electrodes form ohmic contact with the heavily doped source and drain regions;

employing a wet etching process to etch away aluminum sesquioxide covering the gate, source and drain electrodes of the GaN high-electron-mobility transistor with a HF solution with a concentration of 5%, so that the gate, source and drain electrodes of the GaN high-electron-mobility transistor are exposed to the outside; and employing an electron beam evaporation process to deposit aluminum metal with a thickness of 200-300 nm on the aluminum sesquioxide dielectric layer, and forming metal interconnections between the drain electrode of the Si metal oxide semiconductor field effect transistor and the source electrode of the GaN high-electron-mobility transistor and between the source electrode of the Si metal oxide semiconductor field effect transistor and the gate electrode of the GaN high-electron-mobility transistor, thereby completing the manufacture of the bidirectional blocking monolithic heterogeneous integrated Cascode-structure field effect transistor.

10. The method of claim 9, wherein employing a transfer printing technology to transfer the monocrystalline silicon thin-film comprises:

sequentially placing the SiN/AlGaN/GaN/substrate chip in acetone, absolute ethanol and deionized water for ultrasonic cleaning, and then blow-drying with a nitrogen gun;

laminating solid-state polydimethylsiloxane PDMS to the SOI wafer from which the buried oxide layer has been etched away, and then separating the two at a speed of 10 cm/s, so that the monocrystalline silicon thin-film adheres to the polydimethylsiloxane PDMS; and laminating the solid-state polydimethylsiloxane PDMS to which the monocrystalline silicon thin-film adheres to the SiN/AlGaN/GaN/substrate chip, and then separating the two at a speed of 1 mm/s, so that the silicon thin-film adheres to the SiN/AlGaN/GaN/substrate chip, thereby completing the transfer of the monocrystalline silicon thin-film.

* * * * *